United States Patent

Tsai

[11] Patent Number: 5,913,132
[45] Date of Patent: Jun. 15, 1999

[54] METHOD OF FORMING A SHALLOW TRENCH ISOLATION REGION

[75] Inventor: Meng-Jin Tsai, Hsinchu Hsien, Taiwan

[73] Assignee: United Microelectronics Corp., Taiwan

[21] Appl. No.: 08/789,531

[22] Filed: Jan. 27, 1997

[30] Foreign Application Priority Data

Nov. 18, 1996 [TW] Taiwan .................................. 85114146

[51] Int. Cl.$^6$ .................................................. H01L 21/76
[52] U.S. Cl. ............................ 438/434; 438/561; 438/563
[58] Field of Search ..................... 438/434, 437, 438/561, 563, FOR 227; 148/DIG. 85, DIG. 86, DIG. 50

[56] References Cited

U.S. PATENT DOCUMENTS

| | | |
|---|---|---|
| 3,607,449 | 9/1971 | Tokuyama et al. . |
| 3,728,784 | 4/1973 | Schmidt . |
| 3,764,411 | 10/1973 | Brown . |
| 3,775,197 | 11/1973 | Sahagun . |
| 3,798,081 | 3/1974 | Beyer . |
| 4,604,150 | 8/1986 | Lin . |
| 4,666,557 | 5/1987 | Collins et al. . |
| 4,669,176 | 6/1987 | Kato . |
| 4,755,486 | 7/1988 | Treichel et al. . |
| 4,782,036 | 11/1988 | Becker et al. . |
| 4,996,168 | 2/1991 | Ozaki et al. . |
| 5,273,934 | 12/1993 | Ehinger et al. . |

OTHER PUBLICATIONS

Wolf, S. "Silicon Processing for the VLSI ERA: vol. 3—The Submicron MOSFET", Lattice Press, pp. 411–412, 1995.

*Primary Examiner*—George Fourson
*Attorney, Agent, or Firm*—Rabin & Champagne, P.C.

[57] ABSTRACT

A method of making a shallow trench isolation region includes providing a silicon substrate. A pad oxide layer is formed over the silicon substrate. A silicon nitride layer is formed over the pad oxide layer. The silicon nitride layer and the pad oxide layer are patterned, and a trench is thus formed in the silicon substrate. A side-wall oxide layer is formed on a surface of the silicon substrate within the trench. A doped oxide layer is formed over the silicon nitride layer and within the trench. A portion of the doped oxide layer is removed to expose the silicon nitride layer. The silicon nitride layer is removed. The pad oxide layer is removed. A sacrificial oxide layer is formed over the silicon substrate. A well is formed in the silicon substrate. The sacrificial oxide layer is removed. A gate oxide layer is formed over the silicon substrate. A polysilicon layer is formed over the silicon substrate. The polysilicon layer is patterned to form a polysilicon gate.

3 Claims, 8 Drawing Sheets

METHOD OF FORMING A SHALLOW TRENCH ISOLATION REGION

BACKGROUND OF THE INVENTION

1. Field of Invention

This invention relates in general to a method of forming a shallow trench isolation (STI) region, and more particularly, to a method of making a shallow trench isolation region that has improved electrical characteristics, improved uniformity of the dielectric material which fills the trench, and improved uniformity during chemical mechanical polishing (CMP) operations.

2. Description of Related Art

The forming of a shallow trench isolation region for an electrical device includes performing anisotropic etching to form a trench in a semiconductor substrate, then filling the trench with an oxide material. In the manufacturing of submicron complementary metallic oxide semiconductors (CMOS), this is a preferred and scaleable isolation technique. The forming of STI regions is preferred over the formation of conventional local oxidation (LOCOS) structures, because STI regions do not exhibit a bird's beak encroachment. However, several technical problems need to be overcome before the use of shallow trench isolation regions becomes widely applied, for example:

(1) The uniformity of the dielectric material which fills the trench (for example, tetra-ethyl-orthosilicate (TEOS) formed using atmospheric pressure chemical vapor deposition (APCVD) methods) limits control of the thickness during chemical mechanical polishing operations.

(2) The wet etching may form grooves in the oxide layer near an edge of the shallow trench, which may cause a kink in the subthreshold voltage occurring in the surface channel of an n-type metallic oxide semiconductor (NMOS), thus increasing the current leakage below a threshold state.

(3) After filling the trench with the dielectric material, high temperatures generated during sealing processes may cause substrate defects that can lead to greater current leakage in the substrate of the final product.

FIGS. 1 through 12 are a series of cross-sectional views showing a conventional shallow trench isolation region being manufactured. Referring to FIG. 1, a pad oxide layer 101, used for protecting the surface of a silicon substrate 100 during subsequent processes, is formed on the silicon substrate 100. Then, a silicon nitride layer 102 is formed over the pad oxide layer 101 using chemical vapor deposition methods. Next, as shown in FIG. 2, a photoresist layer 103 is formed over the silicon nitride layer 102. Using photolithographic techniques, a shape as shown in FIG. 2 is formed. Referring to FIG. 3, the silicon nitride layer 102, pad oxide layer 101, and silicon substrate 100 are sequentially etched to form a shallow trench 104. Next, the photoresist layer 103 is removed.

Referring to FIG. 4, in a subsequent step a side-wall oxide layer 105 is grown on the surface of the silicon substrate 100 within the shallow trench 104. Thereafter, as shown in FIG. 5, a silicon oxide layer 106 is deposited and fills the shallow trench 104. For example, TEOS is formed in the trench using an APCVD method. Then, a sealing operation is performed at a high temperature for approximately ten minutes. However, due to the height of the silicon oxide layer 106 (which projects beyond the boundaries of the trench), the sealing operation may cause substrate defects. Using the silicon nitride layer 102 as a polishing end point, chemical mechanical polishing (CMP) is performed to remove excess portions of the silicon oxide layer 106, thus resulting in the cross-section shown in FIG. 6.

Referring to FIG. 7, silicon nitride layer 102 is removed, thus exposing pad oxide layer 101 while leaving behind silicon oxide layer 106. Then, pad oxide layer 101 is removed by immersing the layer 101 in a hydrofluoric acid (HF) solution. Concurrent with the removal of pad oxide layer 101, a portion of silicon oxide layer 106 is etched to obtain the cross section shown in FIG. 8.

Referring next to FIG. 9, a sacrificial oxide layer 107 is grown on the silicon substrate 100 and serves as a protective layer. Thereafter, an ion implantation procedure is performed to create a well 108, which may be, for example, a P-type well or an N-type well. The sacrificial oxide layer 107 is then removed by immersing the layer 107 into the hydrofluoric acid solution, thus forming the cross-section shown in FIG. 10. This operation often causes the formation of grooves 109 near the wall edges of the trench.

Referring to FIG. 11, using a high temperature, a gate oxide layer 110 is grown over the silicon substrate 100. A polysilicon layer 111 is then deposited over silicon substrate 100 using a chemical vapor deposition method. Using photolithographic and etching processes, polysilicon layer 111 is shaped as shown in FIG. 12 to form polysilicon gate 111'. Because polysilicon gate 111' lays across gate oxide layer 110 and oxide layer 106, a portion of the gate may cover the oxide grooves 109, thus causing a kink to occur in the subthreshold voltage.

An NMOS transistor having a gate oxide layer thickness of 60 Å, drain voltage of 0.1 V, channel width of 10 mm, channel length of 0.25 mm, and a substrate voltage between 0 and −4 V, was provided and tested to determine the relationship between drain current and the gate voltage when the aforementioned kink in the subthreshold voltage was present. The results are shown in FIG. 13. The relationship between the drain current and the gate voltage in the absence of such a kink is shown in FIG. 14. As shown in FIG. 13, the kinked region in the graph is a result of disadvantageous subthreshold voltage distortion.

SUMMARY OF THE INVENTION

It is therefore an object of this invention to provide an improved process for making a shallow trench isolation region, in which a multi-layer dielectric is deposited using a chemical vapor deposition method. The method includes: providing a silicon substrate. A pad oxide layer is formed over the silicon substrate. A silicon nitride layer is formed over the pad oxide layer. The silicon nitride layer and the pad oxide layer are patterned to form a trench in the silicon substrate. A side-wall oxide layer is formed on a surface of the silicon substrate within the trench. A doped oxide layer is formed over the silicon nitride layer and the side-wall oxide layer within the trench. A portion of the doped oxide layer is removed to expose the silicon nitride layer. The silicon nitride layer is removed. The pad oxide layer is removed. A sacrificial oxide layer is formed over the silicon substrate. A well is formed in the silicon substrate. The sacrificial oxide layer is removed. A gate oxide layer is formed over the silicon substrate. A polysilicon layer is formed over the silicon substrate. The polysilicon layer is patterned to form a polysilicon gate. According to one aspect of the invention, a doped oxide layer, for example, doped with borophosphosilicate glass (BPSG), phosphosilicate glass (PSG) or borosilicate glass (BSG), is formed on the side-wall oxide layer and the silicon nitride layer during manufacturing. The invention improves the uniformity of the dielectric, improves the overall control of the thickness in the chemical mechanical polishing operation, reduces the chances of imperfections occurring in the subthreshold region, and reduces substrate defects generated by the high temperature sealing process.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

FIGS. 15 through 21 are cross-sectional views of a shallow trench isolation region showing various manufacturing steps according to one preferred embodiment of this invention.

Figure 1:
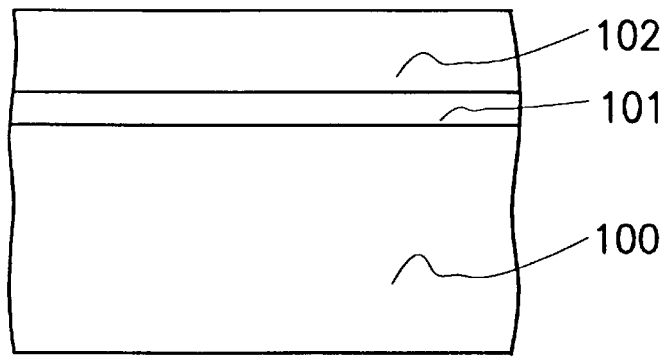
FIGS. 1 through 12 are cross-sectional views of a conventional shallow trench isolation region at various sequential manufacturing steps.
Figure 2:
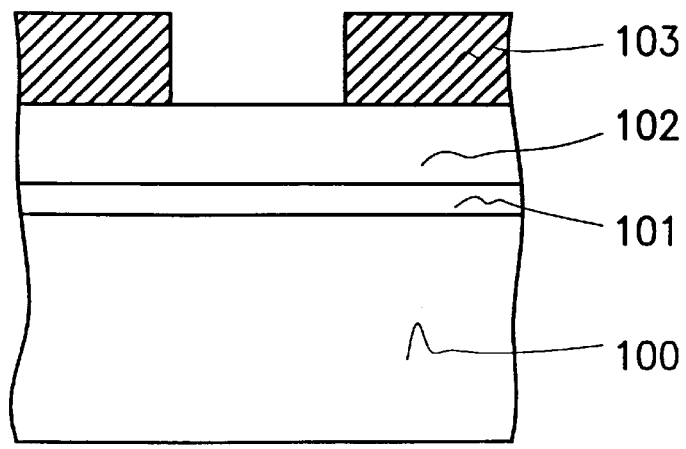
Figure 3:
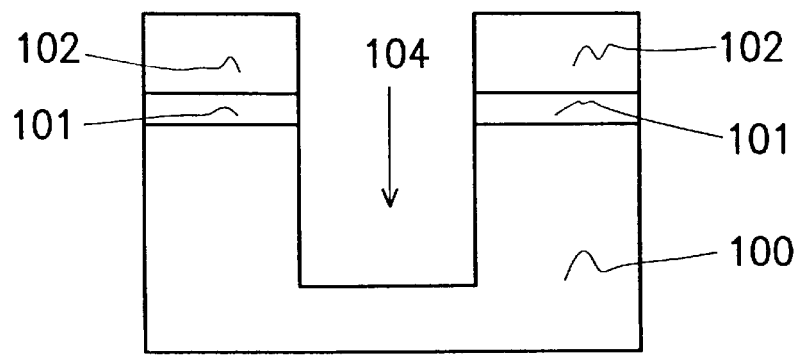
Figure 4:
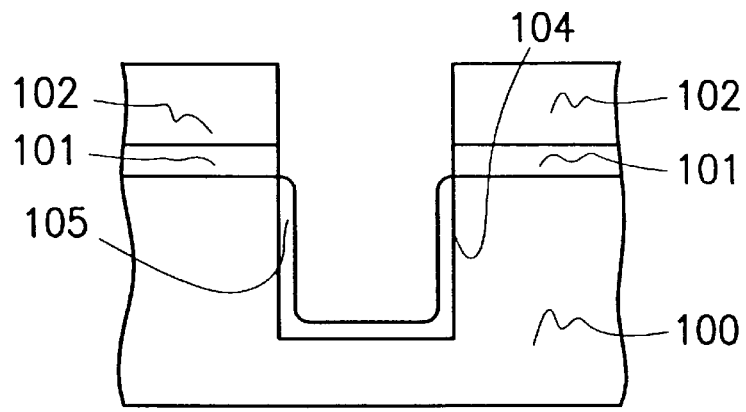
Figure 5:
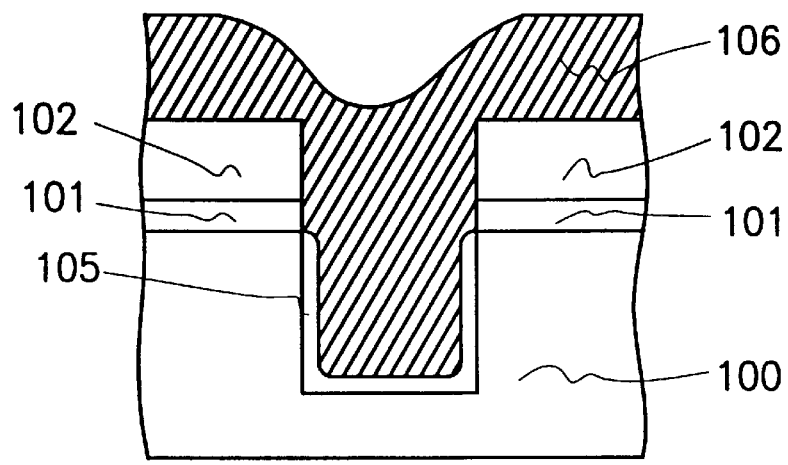
Figure 6:
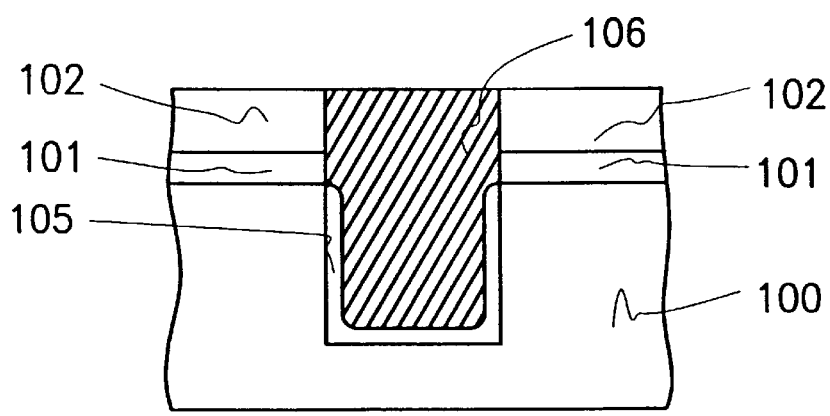
Figure 7:
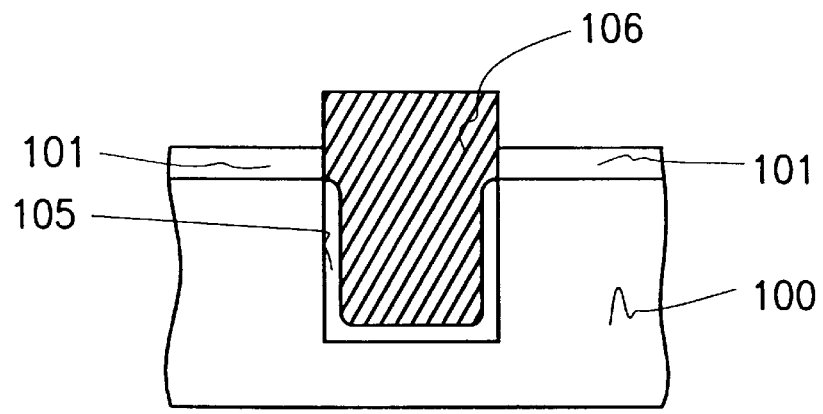
Figure 8:
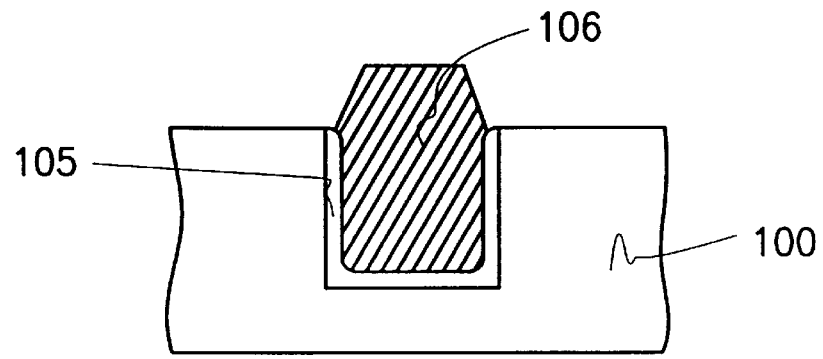
Figure 9:
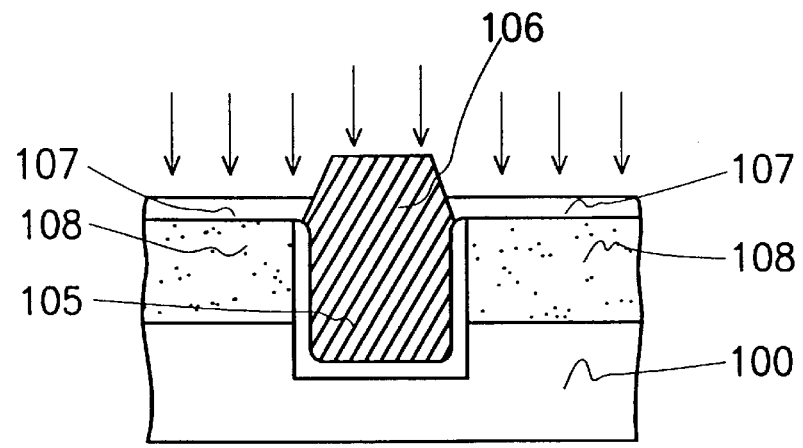
Figure 10:
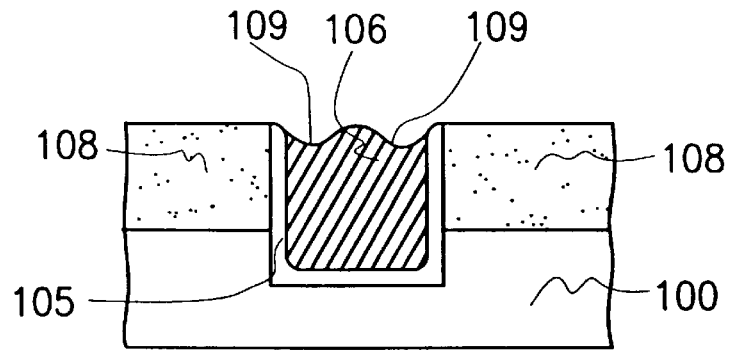
Figure 11:
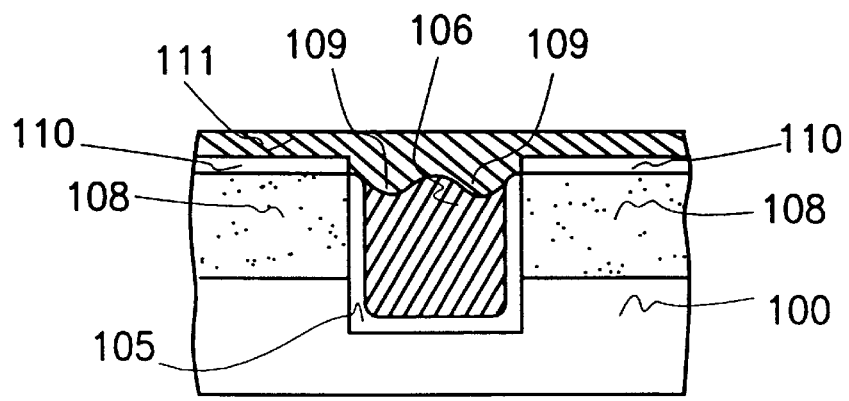
Figure 12:
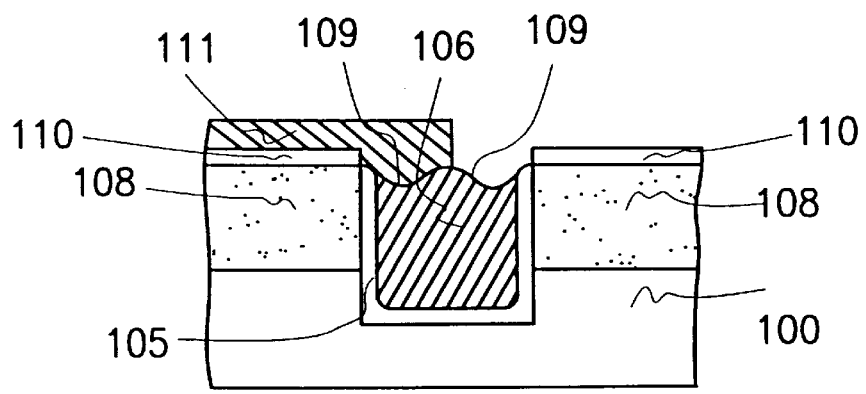
Figure 13:
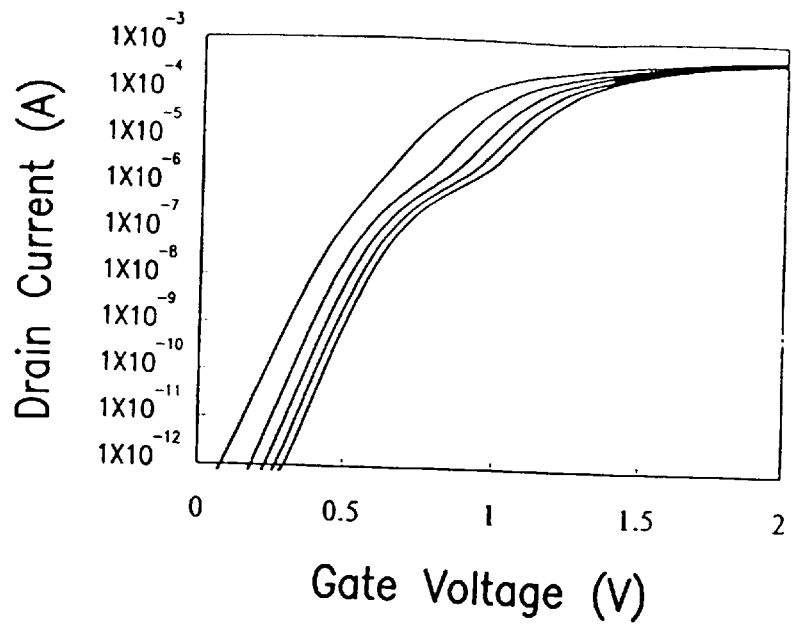
FIG. 13 is a graph showing the relationship between the gate voltage and the drain current of an NMOS, having a kink in the subthreshold voltage.
Figure 14:
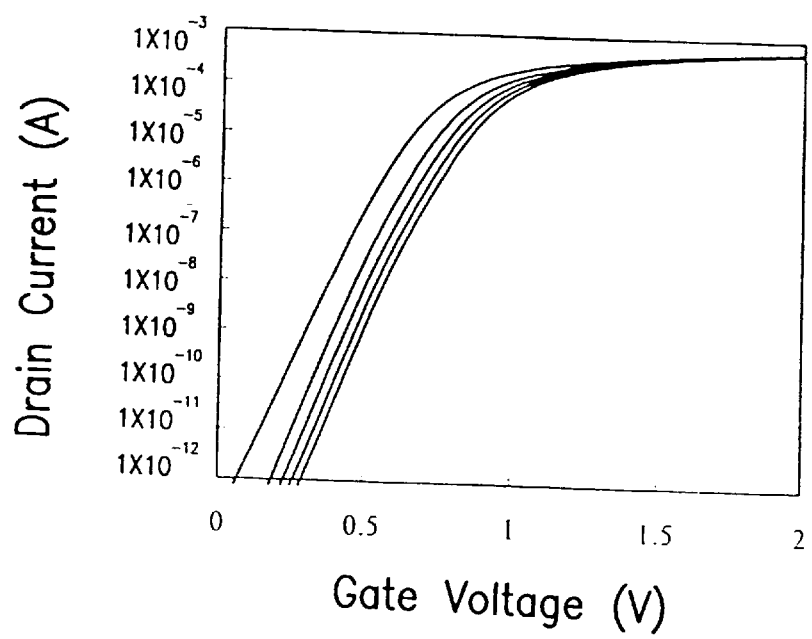
FIG. 14 is a graph showing the relationship between the gate voltage and the drain current of an NMOS in the absence of a kink in the subthreshold voltage.

In this embodiment, the first portions of the manufacturing process are similar to conventional techniques, for example, the manufacturing of the structure shown in FIGS. 1 through 4. Hence, the subsequent manufacturing steps described below are based on the known structure shown in FIG. 4. For the sake of simplicity, structural elements in this embodiment that are identical to those shown in FIG. 4 are labeled with the same reference numerals.

Figure 15:
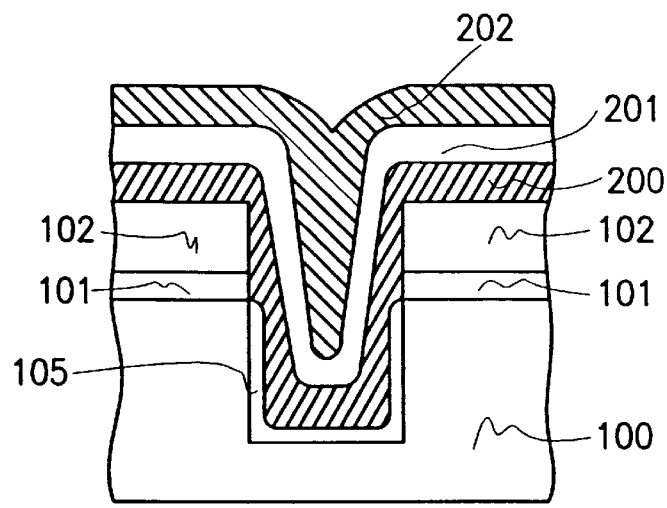
FIGS. 15 through 21 are cross-sectional views of a shallow trench isolation region being formed according to this invention, at various stages of manufacturing.
Figure 16:
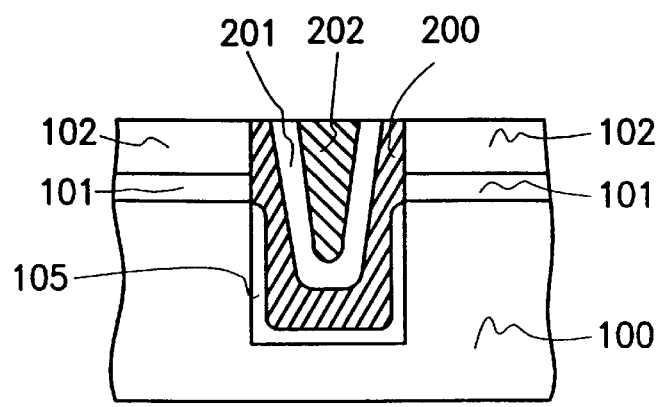

Referring to FIG. 15, a dielectric material, for example, an oxide material doped with borophosphosilicate glass, phosphosilicate glass or borosilicate glass (depending on the requirements), is deposited over the silicon substrate 100 using, for example, CVD methods to form an oxide layer 200. Then, an undoped oxide is deposited over the silicon substrate 100 using, for example, CVD techniques to form a first thin film layer 201. An oxide doped with borophosphosilicate glass, phosphosilicate glass or borosilicate glass is deposited over the silicon substrate 100 using, for example, CVD techniques to form a second thin film layer 202.

Figure 17:
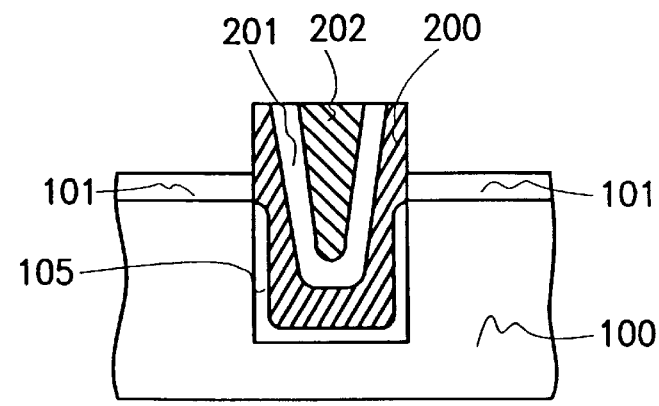
Figure 18:
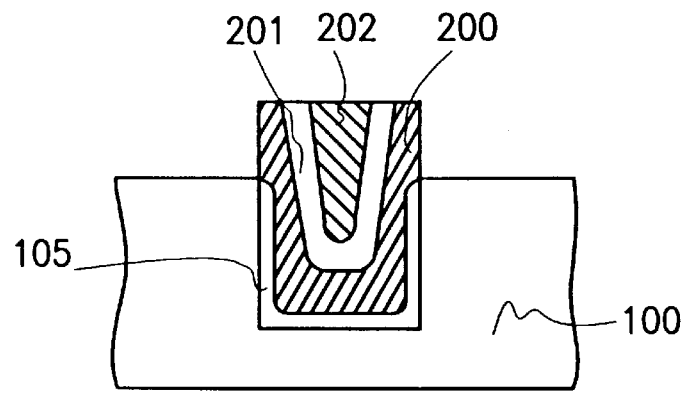

Subsequently, the dielectrics are sealed in a high temperature chamber for ten minutes. Then, using the silicon nitride layer 102 as a polishing end point redundant portions are removed using chemical mechanical polishing techniques to obtain the cross section shown in FIG. 16. Next, the silicon nitride layer 102 is removed, exposing the pad oxide layer 101 as shown in FIG. 17. Thereafter, the pad oxide layer 101 is etched away, along with a portion of the oxide layer, by immersing the layers in a solution of hydrofluoric acid (HF) to obtain the cross section shown in FIG. 18.

Figure 19:
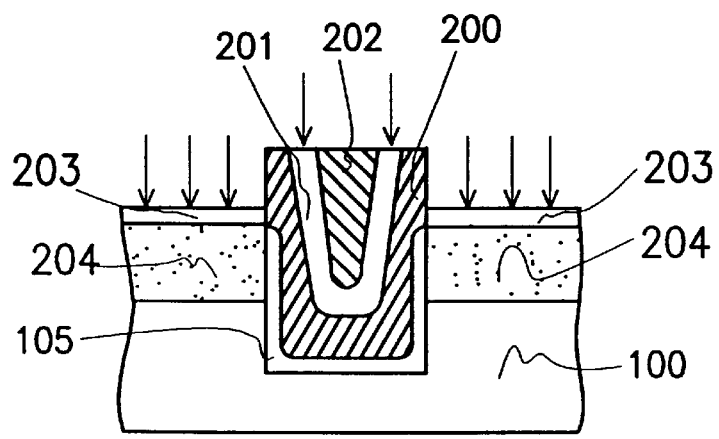
Figure 20:
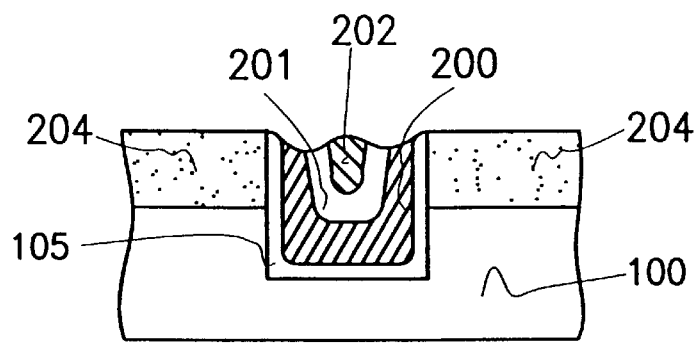

Referring next to FIG. 19, a sacrificial oxide layer 203 is grown on silicon substrate 100 using thermal oxidation techniques, and to a thickness of approximately 200 Å to 400 Å. The oxide layer 203 serves as a protective layer to prevent damage to the surface of the silicon substrate 100. Ion implantation is subsequently performed to form a well 204, which can be, for example, an N-type or a P-type well. The sacrificial oxide layer 203 is etched away by immersing the layer 203 in a hydrofluoric acid solution to obtain the cross section shown in FIG. 20.

Figure 21:
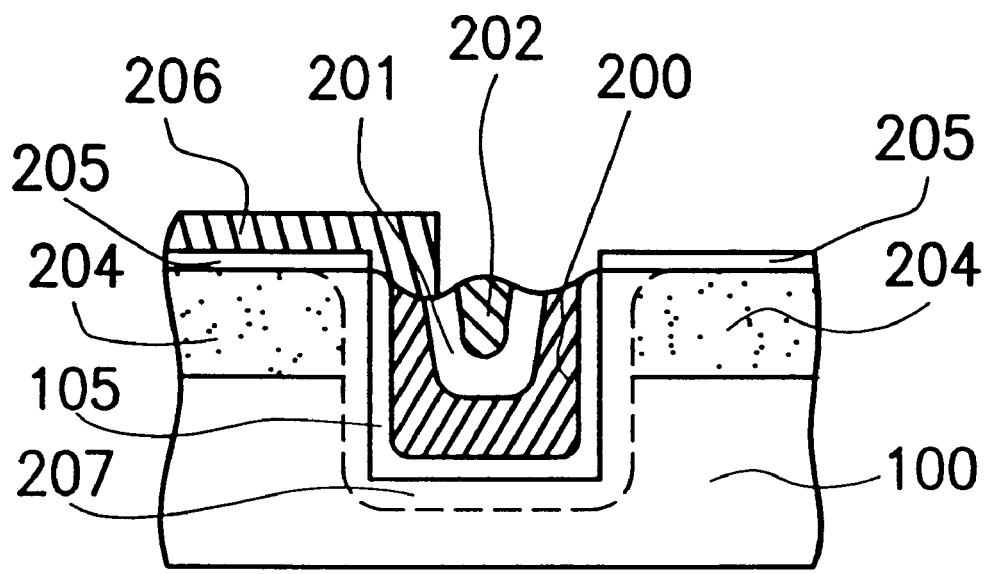

Referring to FIG. 21, in a subsequent step a gate oxide layer 205 is grown, at a high temperature, over the surface of the silicon substrate 100. A polysilicon layer is deposited over the surface of the silicon substrate 100 using a chemical vapor deposition method. Finally, using photolithographic and etching processes, a polysilicon gate 206 is obtained. Simultaneously, dopants inside the oxide layer 200 will penetrate through the side-wall oxide layer 105 into the surrounding silicon substrate 100 to form an impurities region 207. Thus, the manufacturing process of the shallow trench isolation region is complete.

In this invention, dopants in the oxide layer 200 penetrate through the side-wall oxide layer 105 into the silicon substrate 100 to form impurities region 207. The dopants comprise phosphorus or boron at a concentration of approximately between 0.1% and 2%. The dopants are deposited at a temperature in a range between approximately 250° C. and 650° C. (depending on the chemical vapor deposition method used), and are capable of conditioning a parasitic corner transistor. For example, boron can be used to increase the subthreshold voltage of a corner transistor, thus reducing the kinks in the subthreshold voltage of an NMOS.

The first thin film layer 201 allows a chemical vapor deposition method to be used without requiring dopants be deposited on the dielectric layer 201, thus helping to obtain a better oxide quality. The dielectric layer 201 can also contain dopants. As such, by selectively choosing the thickness of the first thin film layer 201, the second thin film layer 202 can be omitted from the trench region. Moreover, the first thin film layer 201 can be a polysilicon layer, which may reduce the coefficient of thermal expansion and lower the level of stress.

The second thin film layer 202 allows chemical vapor deposition methods to be used with dopants to form the dielectric. Planarization during the sealing operation improves the control of the uniformity during chemical mechanical polishing operations. Furthermore, because the temperature required for depositing a doped dielectric is lower than the temperature needed to deposit a dielectric without dopants, the number of substrate defects is greatly reduced. Further, the second thin film layer 202 can be made from a material such as boron nitride (BN), or from more compact dielectric materials, for example, silicon nitride formed by plasma enhanced chemical vapor deposition (PECVD) methods. The compact silicon nitride can lower the removal rate in chemical mechanical polishing processes, and can improve the results of the chemical mechanical polishing operations, thus avoiding a dishing effect (i.e., the phenomenon of a large area in the insulating region caving in).

In general, the number of layers used in the dielectric that fill the shallow trench according to this invention is flexible and can be, for example, a single layer, a double layer, a triple layer or more, depending on design criteria. Also, since the topmost dielectric layer contains dopants, the subsequent sealing operation results in a reflowing that has a planarization effect. Such reflowing improves the uniformity of the chemical vapor deposited dielectric, and increases the overall control of the planarization during chemical mechanical polishing operations.

Therefore, this invention has several advantageous features. For example, the multi-layer, chemical vapor deposited dielectric serves as the dielectric in the shallow trench isolation region. Moreover, the topmost layer of the dielectric is doped with dopants, such as borophosphosilicate glass, borosilicate glass or phosphosilicate glass.

Further, this invention uses a reflowing effect of a doped dielectric to improve the uniformity of the wafer thickness, and to improve control of the wafer's thickness during chemical mechanical polishing operations.

Moreover, this invention uses doped dielectrics to lower the sealing temperature (as compared with an undoped dielectric); therefore, the number of substrate defects generated during the sealing process is correspondingly lowered.

Additionally, the doped dielectric may, as a result of the reflowing process, result in better thickness uniformity, lower film tension, and a higher deposition rate.

Further, the boron/phosphorus dopants used in the doped dielectric can be diffused into the peripheral region of the trench (i.e., diffused from the side-wall during the sealing operation), and may act as dopants for conditioning the subthreshold voltage of the parasitic transistor, as well as helping to eliminate adverse effects when operating under a subthreshold state (due to the oxide grooves; for example, a dopant such as boron can increase the threshold voltage of parasitic capacitance in an NMOS).

By combining the control of the dielectric compositions, the deposition thickness, and the deposition procedure, an optimal solution for the manufacturing of a shallow trench isolation region is obtained.

While the invention has been described by way of example and in terms of a preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of making a shallow trench isolation region, comprising:
   (a) providing a silicon substrate;
   (b) forming a pad oxide layer over the silicon substrate;
   (c) forming a silicon nitride layer over the pad oxide layer;
   (d) patterning the silicon nitride layer and the pad oxide layer, and forming a trench in the silicon substrate;
   (e) forming a side-wall oxide layer on a surface of the silicon substrate within the trench;
   (f) forming a doped oxide layer over the silicon nitride layer and the side-wall oxide layer within the trench;
   (g) forming, at least once, and after operation (f), a first thin film layer followed by forming a second thin film layer comprised of oxide having a portion doped with borophosphosilicate glass;
   (h) removing, after operation (g), a portion of the doped oxide layer to expose the silicon nitride layer, and removing a portion of the first thin film layer and a portion of the second thin film oxide layer to expose the silicon nitride layer;
   (i) removing the silicon nitride layer;
   (j) removing the pad oxide layer;
   (k) forming a sacrificial oxide layer over the silicon substrate;
   (l) forming a well in the silicon substrate;
   (m) removing the sacrificial oxide layer;
   (n) forming a gate oxide layer over the silicon substrate;
   (o) forming a polysilicon layer over the silicon substrate;
   (p) causing dopants in the doped oxide layer to penetrate through the side-wall oxide layer and into the silicon substrate to form an impurities region around an entire periphery of the trench, so as to reduce adverse effects when operating at a subthreshold voltage; and
   (q) patterning the polysilicon layer to form a polysilicon gate.

2. A method of making a shallow trench isolation region, comprising:
   (a) providing a silicon substrate;
   (b) forming a pad oxide layer over the silicon substrate;
   (c) forming a silicon nitride layer over the pad oxide layer;
   (d) patterning the silicon nitride layer and the pad oxide layer, and forming a trench in the silicon substrate;
   (e) forming a side-wall oxide layer on a surface of the silicon substrate within the trench;
   (f) forming a doped oxide layer over the silicon nitride layer and the side-wall oxide layer within the trench;
   (g) forming, at least once, and after operation (f), a first thin film layer followed by forming a second thin film layer comprised of oxide having a portion doped with borosilicate glassy;
   (h) removing, after operation (g), a portion of the doped oxide layer to expose the silicon nitride layer, and removing a portion of the first thin film layer and a portion of the second thin film oxide layer to expose the silicon nitride layer;
   (i) removing the silicon nitride layer;
   (j) removing the pad oxide layer;
   (k) forming a sacrificial oxide layer over the silicon substrate;
   (l) forming a well in the silicon substrate;
   (m) removing the sacrificial oxide layer;
   (n) forming a gate oxide layer over the silicon substrate;
   (o) forming a polysilicon layer over the silicon substrate;
   (p) causing dopants in the doped oxide layer to penetrate through the side-wall oxide layer and into the silicon substrate to form an impurities region around an entire periphery of the trench, so as to reduce adverse effects when operating at a subthreshold voltage; and
   (q) patterning the polysilicon layer to form a polysilicon gate.

3. A method of making a shallow trench isolation region, comprising:
   (a) providing a silicon substrate;
   (b) forming a pad oxide layer over the silicon substrate;
   (c) forming a silicon nitride layer over the pad oxide layer;
   (d) patterning the silicon nitride layer and the pad oxide layer, and forming a trench in the silicon substrate;
   (e) forming a side-wall oxide layer on a surface of the silicon substrate within the trench;
   (f) forming a doped oxide layer over the silicon nitride layer and the side-wall oxide layer within the trench;
   (g) forming, at least once, and after operation (f), a first thin film layer followed by forming a second thin film layer comprised of oxide having a portion doped with phosphosilicate glass;
   (h) removing, after operation (g), a portion of the doped oxide layer to expose the silicon nitride layer, and removing a portion of the first thin film layer and a portion of the second thin film oxide layer to expose the silicon nitride layer;
(i) removing the silicon nitride layer;
(j) removing the pad oxide layer;
(k) forming a sacrificial oxide layer over the silicon substrate;
(l) forming a well in the silicon substrate;
(m) removing the sacrificial oxide layer;
(n) forming a gate oxide layer over the silicon substrate;
(o) forming a polysilicon layer over the silicon substrate;
(p) causing dopants in the doped oxide layer to penetrate through the side-wall oxide layer and into the silicon substrate to form an impurities region around an entire periphery of the trench, so as to reduce adverse effects when operating at a subthreshold voltage; and
(q) patterning the polysilicon layer to form a polysilicon gate.

* * * * *